United States Patent
Kim

(10) Patent No.: US 9,395,620 B2
(45) Date of Patent: Jul. 19, 2016

(54) PELLICLE

(71) Applicant: SAMSUNG ELECTRONICS CO., LTD., Suwon-si, Gyeonggi-do (KR)

(72) Inventor: Hoon Kim, Suwon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 182 days.

(21) Appl. No.: 14/338,611

(22) Filed: Jul. 23, 2014

(65) Prior Publication Data

US 2015/0212433 A1 Jul. 30, 2015

(30) Foreign Application Priority Data

Jan. 28, 2014 (KR) .................. 10-2014-0010037

(51) Int. Cl.
G03F 1/64 (2012.01)
G03F 1/62 (2012.01)
G03F 1/22 (2012.01)
G03F 7/20 (2006.01)

(52) U.S. Cl.
CPC .. *G03F 1/64* (2013.01); *G03F 1/22* (2013.01); *G03F 1/62* (2013.01); *G03F 7/70983* (2013.01)

(58) Field of Classification Search
CPC ............... G03F 1/64; G03F 1/62; G03F 1/22; G03F 7/70983

USPC .................. 430/5; 359/511; 428/14
See application file for complete search history.

(56) References Cited

U.S. PATENT DOCUMENTS

| 6,492,067 B1 | 12/2002 | Klebanoff et al. |
| 2007/0287074 A1 | 12/2007 | Pas |
| 2012/0200921 A1 | 8/2012 | Hamada |
| 2013/0065160 A1 | 3/2013 | Lao |
| 2013/0089814 A1 | 4/2013 | Kim et al. |
| 2013/0095417 A1 | 4/2013 | Kozeki |

FOREIGN PATENT DOCUMENTS

| JP | 05-216214 A | 8/1993 |
| JP | 11-295880 A | 10/1999 |
| JP | 2006-091667 A | 4/2006 |
| JP | 2010-102357 A | 5/2010 |
| KR | 10-2001-0084145 A | 9/2001 |
| KR | 10-2004-0005355 A | 1/2004 |
| KR | 10-2004-0060569 A | 7/2004 |
| KR | 10-2006-0068650 A | 6/2006 |
| KR | 10-2013-0067325 A | 6/2013 |

*Primary Examiner* — Christopher Young
(74) *Attorney, Agent, or Firm* — Lee & Morse, P.C.

(57) ABSTRACT

A pellicle includes a first frame affixing a reticle, the first frame having a tapered locking groove, a second frame on the first frame, the second frame having a locking portion that is detachably combined with the tapered locking groove of the first frame, and a membrane affixed to the second frame.

20 Claims, 8 Drawing Sheets

PELLICLE

CROSS-REFERENCE TO RELATED APPLICATION

Korean Patent Application No. 10-2014-0010037, filed on Jan. 28, 2014, in the Korean Intellectual Property Office, and entitled: "Pellicle," is incorporated by reference herein in its entirety.

BACKGROUND

1. Field

Example embodiments relate to a pellicle. More particularly, example embodiments relate to a pellicle configured to protect a reticle.

2. Description of the Related Art

Generally, a reticle may be used for forming a desired pattern on a semiconductor substrate. Thus, the reticle may have a reticle pattern corresponding to the desired pattern on the semiconductor substrate, and a pellicle may be used for protecting the reticle pattern from an external environment.

The pellicle may include a frame and a membrane. The reticle may be fixed to the frame. The membrane may be fixed to the frame. The membrane may include a transparent material for allowing light to pass through the membrane to the reticle.

SUMMARY

According to example embodiments, there may be provided a pellicle. The pellicle may include a frame, a membrane, and a holder. The frame may be configured to fix a reticle. The frame may have a tapered groove. The membrane may face the reticle. The holder may be configured to fix the membrane. The holder may have a locking portion detachably combined with the tapered groove.

In example embodiments, the frame may have a tapered locking jaw configured to form the tapered groove.

In example embodiments, the tapered locking jaw may have a gradually decreased thickness toward an outer surface of the frame.

In example embodiments, the tapered locking jaw may have a rounded end.

In example embodiments, a gap may be formed between the tapered locking jaw and the locking portion.

In example embodiments, the locking portion may have a tapered shape corresponding to the tapered locking groove.

In example embodiments, the locking portion may include a resilient material bent by a pressure applied to the locking portion for allowing the locking portion to be released from the tapered locking groove.

In example embodiments, a receiving groove configured to receive the bent locking portion may be formed at a connection between the locking portion and the holder.

In example embodiments, the locking portion may include an aluminum alloy.

In example embodiments, the tapered locking groove may be arranged at both side surfaces of the frame.

In example embodiments, the locking portion may have an outer surface substantially coplanar with outer surfaces of the frame.

In example embodiments, the reticle may include an extreme ultraviolet (EUV) reticle.

According to example embodiments, there may be provided a pellicle. The pellicle may include a first frame, a second frame and a membrane. The first frame may be configured to fix a reticle. The first frame may have a tapered groove. The second frame may have a locking portion detachably combined with the tapered groove. The membrane may be fixed to the second frame.

In example embodiments, the locking portion may include a resilient material bent by a pressure applied to the locking portion for allowing the locking portion to be released from the tapered locking groove.

In example embodiments, a receiving groove configured to receive the bent locking portion may be formed at a connection between the locking portion and the second frame.

According to example embodiments, there may be provided a pellicle. The pellicle may include a first frame affixing a reticle, the first frame having a tapered locking groove, a second frame on the first frame, the second frame having a locking portion with a locker having a complementary shape with respect to the tapered locking groove of the first frame and is detachably combinable with the tapered locking groove of the first frame, and a membrane affixed to the second frame, the second frame being between the membrane and the first frame.

In example embodiments, the second frame may be a frame-shaped holder, the locking portion including a locking body extending vertically from an outer surface of the holder toward the first frame, and the locker extending from the locking body toward the tapered locking groove, the locker having a decreasing thickness along the vertical direction.

In example embodiments, the first frame may include a tapered locking jaw, the tapered locking jaw extending from a sidewall of the first frame toward the locking body, and the tapered locking groove may be defined between the tapered locking jaw and a bottom of the first frame, the locker fitting in the tapered locking groove when the holder is combinable with the first frame.

In example embodiments, the holder may include a flat portion extending horizontally above the locking jaw, an upper groove being defined between the locking jaw and the flat portion of the holder.

In example embodiments, the locking body and the locker may be integral with each other and may include a resilient metal, an upper portion of the locking body being bendable into the upper groove.

BRIEF DESCRIPTION OF THE DRAWINGS

Example embodiments will be more clearly understood from the following detailed description taken in conjunction with the accompanying drawings.

FIG. 1 illustrates an exploded perspective view of a pellicle in accordance with example embodiments;

FIG. 2 illustrates an assembled perspective view of the pellicle in FIG. 1;

FIG. 3 illustrates a cross-sectional view taken along line III-III' in FIG. 2;

FIGS. 4 to 6 illustrate cross-sectional views of operations during dissembling a holder from a frame of the pellicle in FIG. 1;

FIG. 7 illustrates an exploded perspective view of a pellicle in accordance with other example embodiments;

FIG. 8 illustrates an assembled perspective view of the pellicle in FIG. 7;

FIG. 9 illustrates a cross-sectional view taken along line IX-IX' in FIG. 8; and FIGS. 10 to 12 illustrate cross-sectional views of operations during dissembling a second frame from a first frame of the pellicle in FIG. 7.

DETAILED DESCRIPTION

Figure 1:
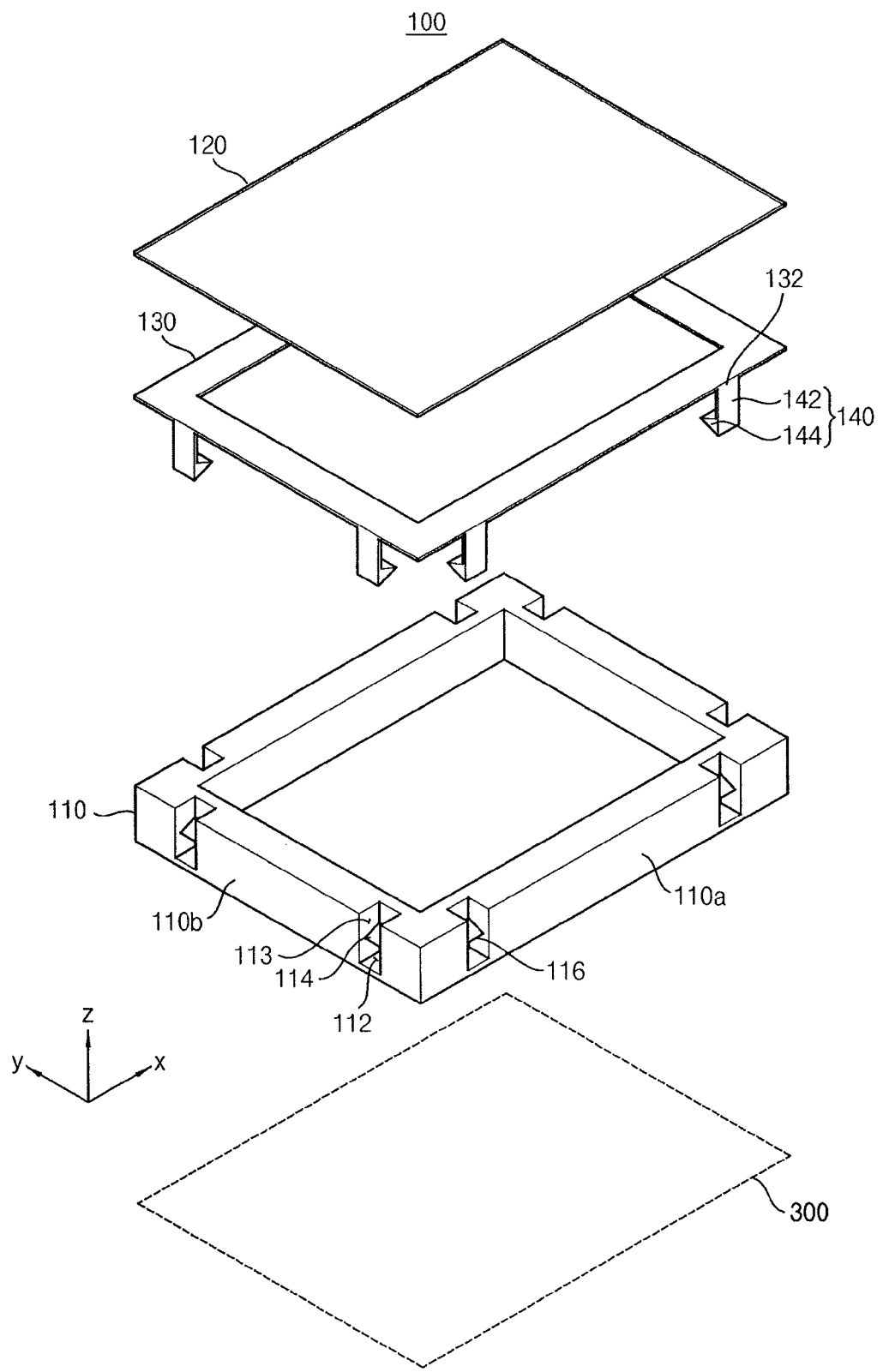
FIGS. 1 to 12 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to those set forth herein. Rather, these example embodiments are provided so that this disclosure will be thorough and complete, and will fully convey the scope of the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated as a rectangle may have rounded or curved corners. Thus, the regions illustrated in the figures are schematic in nature and their shapes are not intended to limit.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
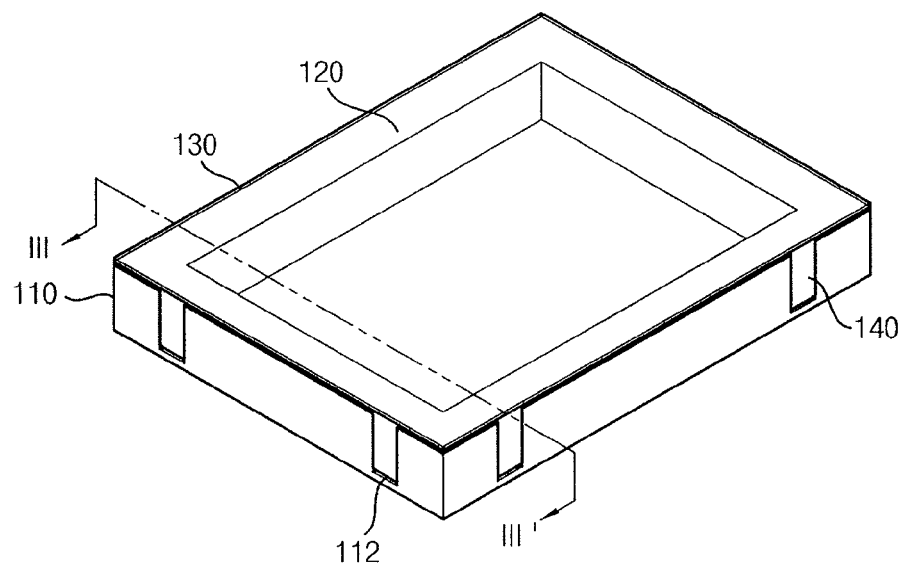
Figure 3:
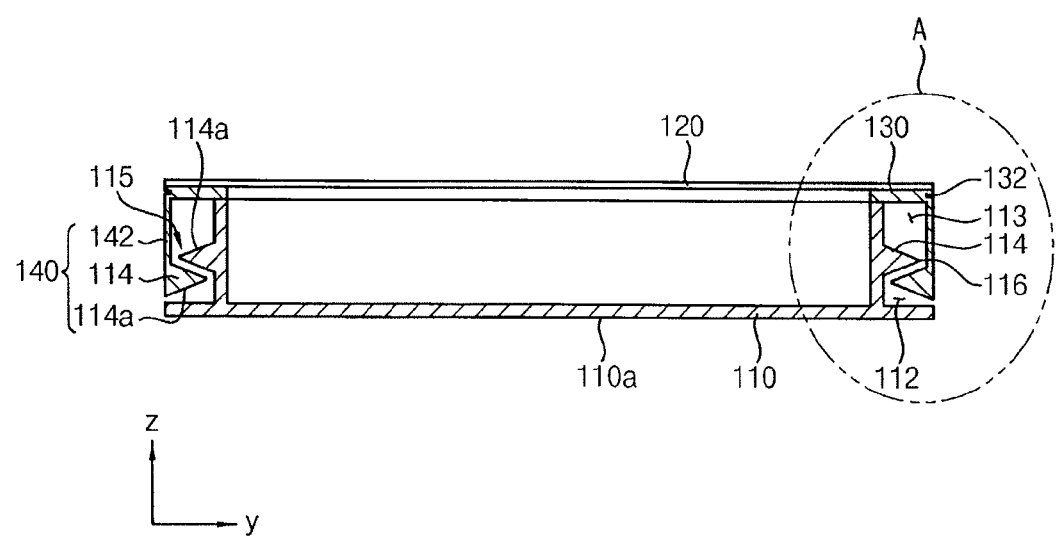

FIG. 1 illustrates an exploded perspective view of a pellicle in accordance with example embodiments, FIG. 2 illustrates an assembled perspective view of the pellicle in FIG. 1, and FIG. 3 illustrates a cross-sectional view along line III-III' in FIG. 2.

Referring to FIGS. 1 to 3, a pellicle 100 of this example embodiment may include a frame 110, a membrane 120, and a holder 130.

In example embodiments, as illustrated in FIG. 1, the frame 110 may have, e.g., a rectangular parallelepiped shape. For example, a rectangular opening may be formed at a central portion of the frame 110. A reticle 300 may be attached to a lower surface 110a of the frame 110 using an adhesive. The shape of the frame 110 may vary in accordance with a shape of the reticle 300. Therefore, the shape of the frame 110 may not be restricted to the rectangular parallelepiped shape. The frame 110 according to example embodiments may be used continuously in an exposure process without structural changes of the frame 110.

In example embodiments, as illustrated in FIGS. 1 and 3, the frame 110 may have grooves. The grooves may be formed at outer side surfaces 110b of the frame 110, e.g., a hollow space may be formed in the outer side surface 110b of the frame 110. For example, a plurality of grooves spaced apart from each other may be formed along an entire perimeter, e.g., along entire lengths of outer side surfaces 110b in the x and y axes, of the frame 110. For example, a depth of each groove in a corresponding portion of the frame 110 may be smaller than a total thickness of the corresponding portion of the frame 110, e.g., a depth of the groove in the frame 110 along the y-axis may be smaller than a thickness of the frame along the y-axis.

A tapered locking jaw 114 may be formed in each groove, e.g., the tapered locking jaw 114 may be formed at a middle portion of an inner surface of each of the grooves. Thus, each of the grooves may be divided into an upper groove 113 and a lower groove 112, i.e., a tapered locking groove 112, by the tapered locking jaw 114. The lower groove 112 and the tapered locking groove 112 may be used hereinafter interchangeably. The tapered locking jaw 114 may have a length shorter than a width of the groove, so the tapered locking jaw 114 may not protrude out beyond the outer side surface 110b of the frame 110. In example embodiments, the tapered locking jaw 114 may have a gradually decreasing thickness in the z-axis toward the outer side surface 110b of the frame 110

(FIG. 3), so the tapered locking groove 112 may have a gradually increasing height along the z-axis toward the outer side surface 110b of the frame 110. For example, the tapered locking jaw 114 may have a decreasing thickness in the z-axis to define a rounded end 16 (FIG. 3).

In example embodiments, the tapered locking grooves 112 and the tapered locking jaws 114 may be formed at both side surfaces of the frame 110. Additionally, the tapered locking grooves 112 and the tapered locking jaws 114 may be formed at the rest of the both side surfaces of the frame 110. For example, as illustrated in FIG. 1, at least one tapered locking groove 112 and at least one tapered locking jaw 114 may be formed at each side of the frame 110, e.g., two tapered locking groove 112 may be formed at opposite ends of each side of the frame 110 with corresponding tapered locking jaws 114.

The membrane 120 may be arranged over the frame 110, e.g., the membrane 120 may be arranged on an upper surface of the frame 110 to overlap the opening through the frame 110. Thus, the membrane 120 may face the reticle 300, e.g., through the opening of the frame 110. Light transmitted through the reticle 300 may be irradiated to a semiconductor substrate through the membrane 120. Thus, the membrane 120 may include a transparent material through which the light may pass.

The holder 130 may be arranged over the frame 110. In example embodiments, the holder 130 may have a shape corresponding to the shape of the frame 110. For example, when the frame 110 has a rectangular parallelepiped shape, the holder 130 may also have a rectangular parallelepiped shape. The membrane 120 may be attached to an upper surface of the holder 130 using an adhesive, e.g., the holder 130 may be between the membrane 120 and the frame 110. A lower surface of the holder 130 may contact an upper surface of the frame 110. The holder 130 may have outer surfaces substantially coplanar with the outer surfaces 110b of the frame 110, as illustrated in FIG. 2.

Figure 5:
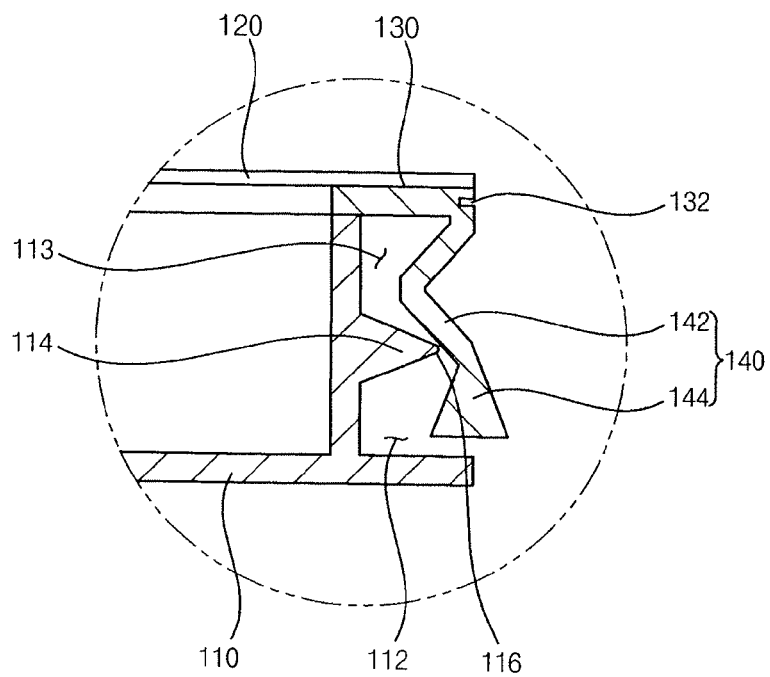

In example embodiments, the holder 130 may include locking portions 140. As illustrated in FIG. 1, each of the locking portions 140 may include a locking body 142 and a locker 144. The locking body 142 may be downwardly extended from an edge portion of the lower surface of the holder 130, e.g., along the z-axis. The locker 144 may be, e.g., approximately, horizontally extended from an inner surface of the locking body 142. The locker 144 may be inserted into the tapered locking groove 112 of the frame 110. Therefore, the holder 130 with the membrane 120 may be firmly fixed to the frame 110 by inserting the locker 144 into the tapered locking groove 112. As such, as shown in FIG. 5, when a force is applied to the locking body 142, e.g., when removing the holder 130, the locking body 142 may be slightly bent into the upper groove 113 so that the locker 144 may be released from the tapered locking groove 112. Therefore, the locking portion 140 may include a resilient material, e.g., metal, bent by the force, e.g., a resilient aluminum alloy.

In example embodiments, the locker 144 may have a shape corresponding to, e.g., complementary with, a shape of the tapered locking groove 112 (FIG. 3). Thus, the locker 144 may have a tapered shape having a gradually decreasing thickness along the z-axis toward an inner surface of the tapered locking groove 112.

In example embodiments, the locking portion 140 may have an outer surface substantially coplanar with the outer surfaces of the frame 110 and the holder 130. If the outer surface of the locking portion 140 is not coplanar with the outer surfaces of the frame 110, e.g., when a part of the locking portion 140 protrudes from the outer surfaces of the frame 110 and the holder 130, the locking portion 140, e.g., the protruding part of the locking portion 140, may collide with fixtures during transfer of the pellicle 100. Thus, the outer surfaces of the locking portion 140, the frame 110, and the holder 130 according to example embodiments are substantially coplanar with each other, so the locking portion 140 does not protrude from, e.g., beyond, the outer surface of the frame 110. As a result, collision or hitching between the pellicle 100 and adjacent fixtures may be prevented during transfer of the pellicle 100.

In example embodiments, the holder 130 with the membrane 120 may be replaced with a new holder 130 and a new membrane 120 in accordance with a lifespan of the membrane 120, while the frame 110 with the reticle according to example embodiments may be continuously used regardless of the replacements of the membrane 120 and the holder 130. Thus, a process for dissembling the holder 130 from the frame 110 and a process for assembling the new holder 130 with the frame 110 may be performed. During the dissembling process and the assembling process according to example embodiments, transfer of force to the frame 110 may be suppressed.

In detail, when force is applied to the frame 110, a tensile force of the frame 110 for supporting the reticle may be changed. The changed tensile force of the frame 110 may distort a pattern of the reticle. The distorted reticle pattern may result in forming an abnormal pattern on the semiconductor substrate. Therefore, in order to suppress the transfer of the force to the frame 110 during the dissembling process and the assembling process, the locking groove 112 may have the tapered shape and the locker 144 may also have the tapered shape corresponding to the tapered shape of the locking groove 112.

In further detail, a gap 115 configured to prevent a contact between the locking portion 140 and the tapered locking jaw 114 may be formed between the locking portion 140 and the tapered locking jaw 114. During the assembling process, a tapered lower surface 144a of the locker 144 may softly make contact with a tapered upper surface 114a of the locking jaw 114, and the tapered lower surface 144a of the locker 144 may descend along the tapered upper surface 114a of the locking jaw 114. After the tapered lower surface 144a of the locker 144 softly makes contact with the rounded end 116 of the locking jaw 114, the locker 144 may be inserted into the tapered locking groove 112. For example, when the holder 130 is lowered along the outer side surface 110b of the frame 110, i.e., along the z-axis, the tapered lower surface 144a of the locker 144 may contact and slide along the tapered upper surface 114a of the locking jaw 114 toward the rounded end 116 to slide around the rounded end 116 into the tapered locking groove 112. Thus, since the complementary tapered shapes of the locking jaw 114 and the locker 144 provide sequential sliding and locking motions of the holder 130 with the frame 110, the force transferred from the locker 144 to the frame 110 may be suppressed.

Further, during the dissembling process, when a force is applied to the locking body 142, the locking body 142 may be bent into the upper groove 113, and the locker 144 may protrude out from locking groove 112, as will be described in more detail below with reference to FIG. 5. Thus, the locking body 142 and the locker 144 may not make contact with the frame 110 during the dissembling process. As such, the force transferred to the frame 110 may be suppressed.

In example embodiments, a receiving groove 132 may be formed at a connection between the holder 130 and the locking portion 140. The receiving groove 132 may be formed at the outer surface of the holder 130. When the locking body 142 is bent, the bent locking body 142 may be received in the receiving groove 132, e.g., the receiving groove 132 may facilitate pivoting of an upper edge of the locking body 142. Thus, a transfer of a force, which may be generated by the bent locking body 142, to the frame 110 through the holder 130 may be suppressed.

Additionally, despite the gap formed between the tapered locking jaw 114 and the locking portion 140, the locking portion 140 may make contact with the rounded end 116 of the tapered locking jaw 114 during the assembling process. If the end of the locking jaw 114 is not rounded, e.g., has a sharp shape, such sharp shape may scratch the locking portion 140, which in turn, may generate particles poorly influencing the reticle. Thus, the tapered locking jaw 114 may have the rounded end 116. Because the rounded end 116 may softly make contact with the locking portion 140, particles may not be generated during the assembling process.

Figure 4:
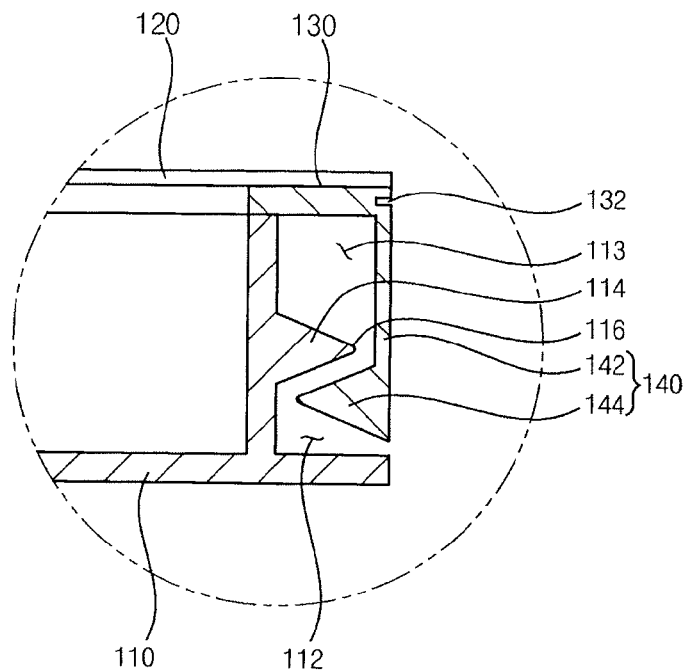
Figure 6:
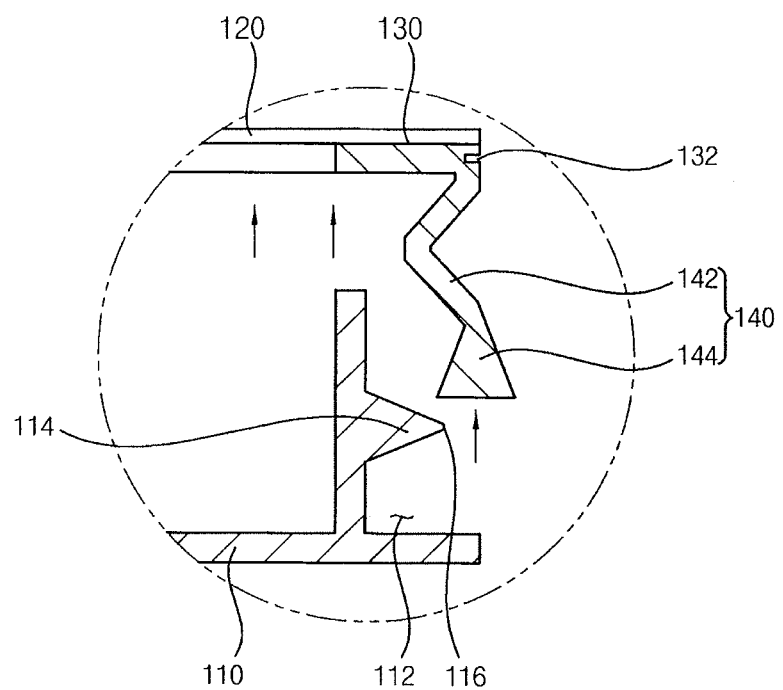

FIGS. 4 to 6 illustrate cross-sectional views of operations for dissembling the holder 130 from the frame 110 of the pellicle 100. FIGS. 4 to 6 illustrated an enlarged portion A of FIG. 2.

Referring to FIG. 4, when the holder 130 and the frame 110 are assembled, the locker 144 of the locking portion 140 is inserted into the tapered locking groove 112. The locking portion 140 may not make contact with the tapered locking jaw 114 and the frame 110. When the pellicle 100 is used for a long time, the membrane 120 may be contaminated. Thus, it may be required to replace the, e.g., combined, holder 130 and membrane 120 with a new, e.g., combined, holder and membrane.

Referring to FIG. 5, when the holder 130 and the frame 110 are dissembled, e.g., separated, a force may be applied to the outer surface of the locking body 142. For example, as illustrated in FIG. 5, a portion of a sidewall of the locking body 142 may be pushed into the upper groove 113, so the locking body 142 is bent into the upper groove 113. Bending of the locking body 142 into the upper groove 113 causes the locker 144 to be released, e.g., move out, from the tapered locking groove 112. The locking portion 140 may not make contact with the frame 110 during the release process. The bent locking body 142 may be received in the receiving groove 132. Thus, the force generated by the bent locking body 142 may not be transferred to the frame 110 through the holder 130.

Referring to FIG. 6, the holder 130 with the membrane 120 may be ascended, e.g., removed, to dissemble the holder 130 from the frame 110. Therefore, a new holder 130 with a new membrane 120 may be combined with the frame 110.

When the new holder 130 is descended toward the frame 110, the tapered lower surface of the locker 144 may softly make contact with the tapered upper surface of the locking jaw 114. The locker 144 may be continuously descended, e.g., along the frame 110 and past the rounded end 116. After the tapered lower surface of the locker 144 softly makes contact with the rounded end 116 of the locking jaw 114, the locker 144 may be inserted into the tapered locking groove 112 by a restoring force of the locker 144. Therefore, the force may not be transferred from the locker 144 to the frame 110.

According to this example embodiment, when the membrane 120 is contaminated, only the holder 130 with the contaminated membrane 120 may be replaced with a new holder and a new membrane, while the frame 110 with the reticle may be maintained for further use, e.g., regardless of the change of the holder with the membrane. Thus, it may not be required to clean the reticle fixed to the frame. As a result, the reticle pattern of the reticle may not be damaged.

Further, the tapered locking groove 112 and the tapered locking portion 140 may suppress the transfer of force to the frame 110 during the dissembling process and the assembling process. As a result, the reticle pattern may not be distorted after the dissembling process and the assembling process, so that the lifespan of the reticle may be increased. Particularly, the frame 110 used in the exposure process may be still used by changing the holder 130 with the membrane 120 without a structural change of the frame 110.

Figure 7:
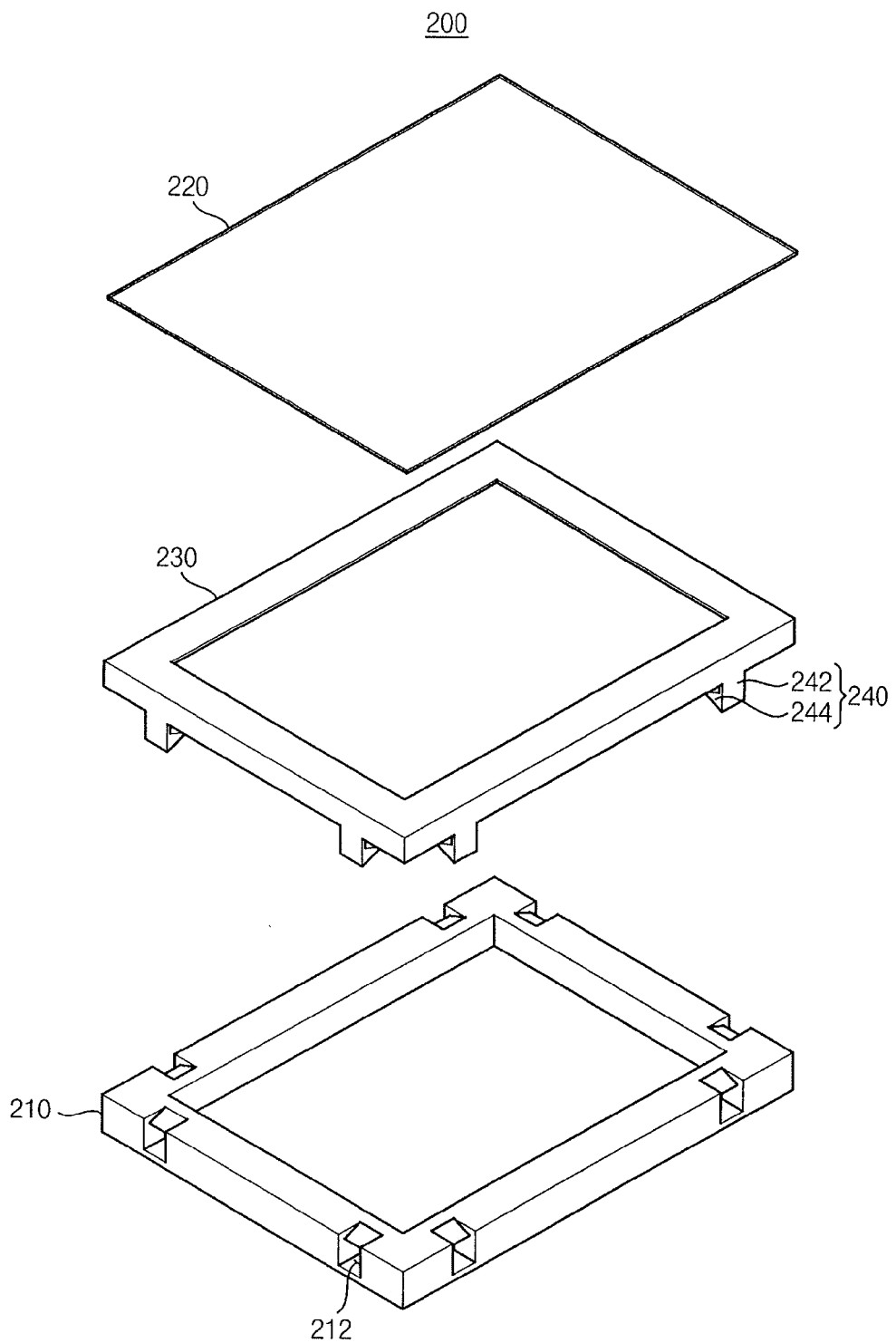
Figure 8:
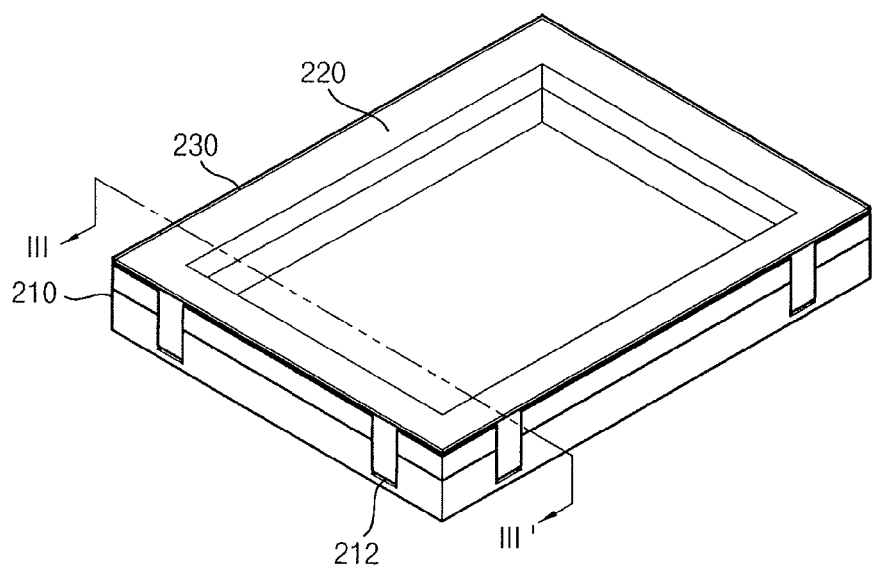
Figure 9:
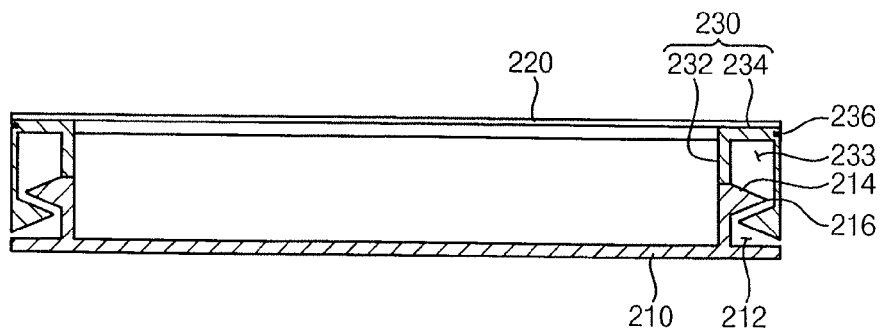

FIG. 7 illustrates an exploded perspective view of a pellicle in accordance with example embodiments, FIG. 8 illustrates an assembled perspective view of the pellicle in FIG. 7, and FIG. 9 illustrates a cross-sectional view along line IX-IX' in FIG. 8.

Referring to FIGS. 7 to 9, a pellicle 200 of this example embodiment may include a frame 210, a membrane 220, and a second frame 230. That is, the pellicle 200 may include the first frame 210 and the second frame 230 formed by dividing the frame 110 in FIG. 1 along the thickness direction. Thus, a summed thickness of the first frame 210 and the second frame 230 along the z-axis may be substantially the same as the thickness of the frame 110 in FIG. 1 along the z-axis. As compared to the pellicle 100 in FIG. 1, the pellicle 200 may not include the holder 130 of FIG. 1.

In example embodiments, the first frame 210 may have a rectangular parallelepiped shape. Thus, a rectangular opening may be formed at a central portion of the first frame 210. A reticle may be attached to a lower surface of the frame 210 using an adhesive.

In example embodiments, the first frame 210 may have a tapered locking groove 212. The tapered locking groove 212 may be formed at an outer surface of the first frame 210. The tapered locking groove 212 may have a gradually increasing thickness along the z-axis toward the outer surface of the first frame 210. In example embodiments, the tapered locking grooves 212 may be formed at both side surfaces of the first frame 210. Additionally, the tapered locking grooves 212 may be formed at the rest of the both side surfaces of the first frame 210.

The second frame 230 may be arranged over the first frame 210. In example embodiments, the membrane 220 may be attached to an upper surface of the second frame 230 using an adhesive. The second frame 230 may include a contact portion 232 and a flange portion 234. The contact portion 232 may have a rectangular parallelepiped shape corresponding to the shape of the first frame 210. The contact portion 232 may have a lower surface configured to make contact with an upper surface of the first frame 210. The flange portion 234 may be horizontally extended from an outer surface of the contact portion 232. Thus, a groove 233 may be formed between a lower surface of the flange portion 234, an outer surface of the contact portion 232, and an upper surface of the first frame 210. The groove 233 may correspond to the upper groove 113 in FIG. 1. The flange portion 234 may have an outer surface substantially coplanar with an outer surface of the first frame 210. A receiving groove 236 may be formed at the outer surface of the flange portion 234.

The second frame 230 may include a locking portion 240. The locking portion 240 may include a structure and a material substantially the same as those of the locking portion 140 in FIG. 1. Thus, any further illustration with respect to the locking portion 240 may be omitted herein for brevity. The locking portion 240 may have an outer surface substantially coplanar with the outer surfaces of the first frame 210 and the second frame 230.

Figure 10:
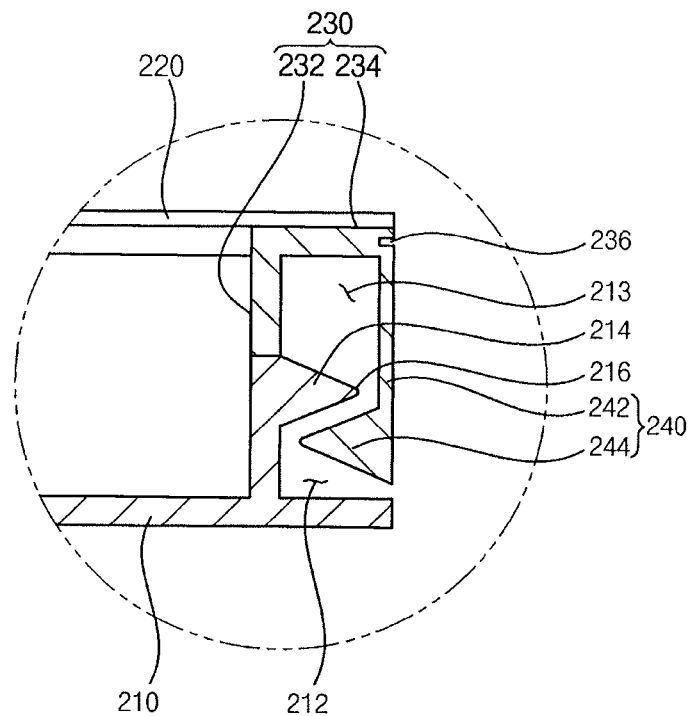
Figure 11:
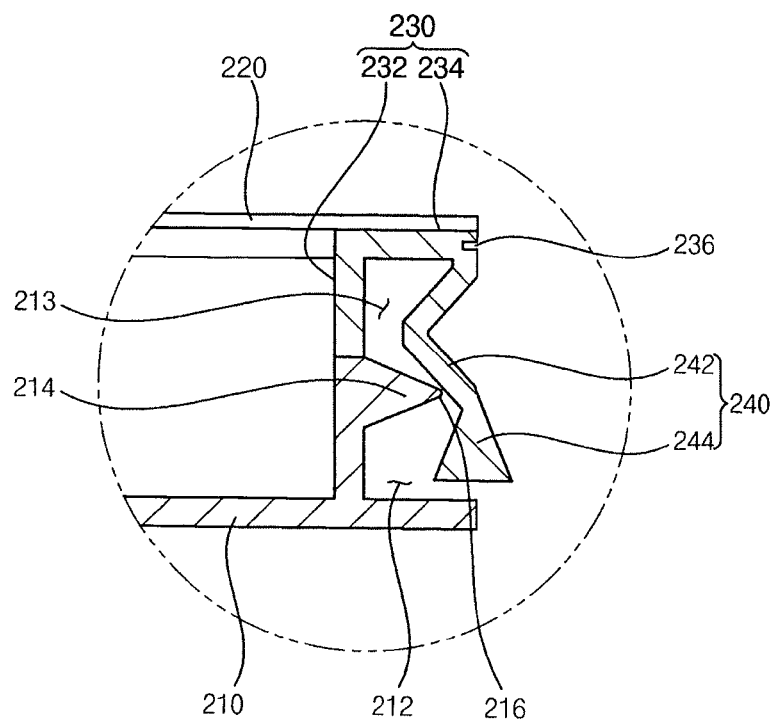
Figure 12:
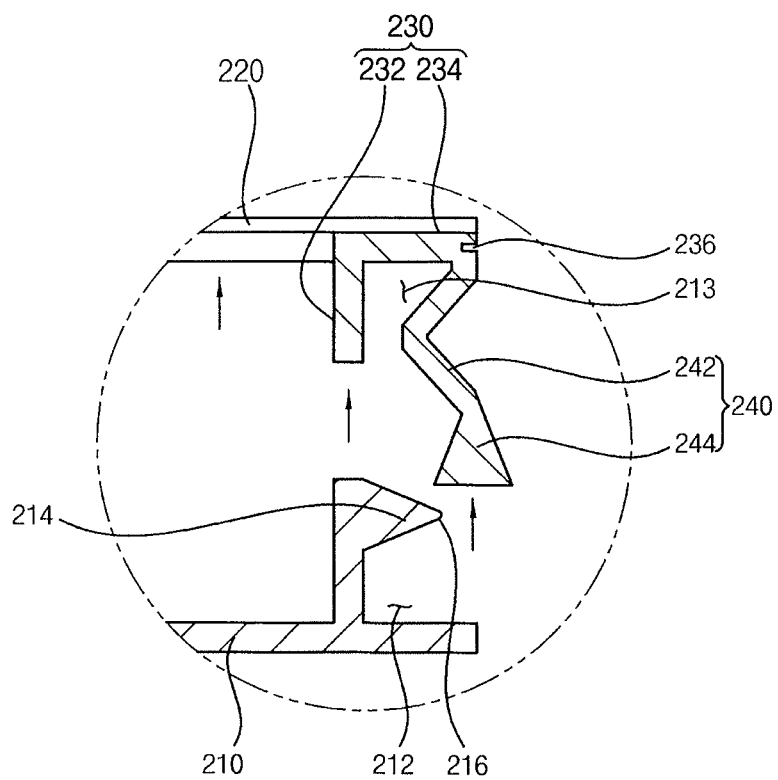

FIGS. 10 to 12 illustrate cross-sectional views of operations for dissembling the second frame 230 from the first frame 210 of the pellicle 200.

Referring to FIG. 10, when the first and second frames 210 and 230 are assembled, a locker 244 of the locking portion 240 of the second frame 230 may be inserted into a tapered locking groove 212 of the first frame 210. The locking portion 240 may not make contact with the first frame 210. When the pellicle 200 is used for a long time, the membrane 220 may be contaminated. Thus, it may be required to replace the, e.g., combined, second frame 230 and membrane 220 with a new, e.g., combined, second frame and membrane.

Referring to FIG. 11, a force may be applied to an outer surface of a locking body 242 of the locking portion 240. The locking body 242 may be bent into the groove 233, thereby releasing the locker 244 from the tapered locking groove 212. The locking portion 240 may not make contact with the first frame 210 during the release process. The bent locking body 242 may be received in the receiving groove 232. Thus, the force generated by the bent locking body 242 may not be transferred to the first frame 210 through the second frame 230.

Referring to FIG. 12, the second frame 230 with the membrane 220 may be ascended to dissemble the second frame 230 from the first frame 210. A new second frame 230 with a new membrane 220 may be combined with the first frame 210.

When the second frame 230 is descended toward the first frame 210, a tapered lower surface of the locker 244 may softly make contact with a rounded end 216 of a locking jaw 214. The locker 244 may be inserted into the tapered locking groove 212 by a restoring force of the locker 244. Therefore, the force may not be transferred from the locker 244 to the first frame 210.

According to this example embodiment, when the membrane 220 is contaminated, only the second frame 230 with the contaminated membrane 220 may be replaced with a new second frame and a new membrane, while the first frame 210 with the reticle may be maintained regardless of the change of the second frame with the membrane. Thus, it may not be required to clean the reticle fixed to the first frame. As a result, the reticle pattern of the reticle may not be damaged.

Further, the tapered locking groove 212 and the locker 244 may suppress the transfer of force to the frame during the dissembling process and the assembling process. As a result, the reticle pattern may not be distorted after the dissembling process and the assembling process so that the lifespan of the reticle may be increased. Particularly, the frame used in the exposure process may be still used by changing the holder with the membrane without structural change of the frame.

In example embodiments, a light source applied to the reticle protected by the pellicles may not be restricted within a specific wavelength. For example, the reticle may include an extreme ultraviolet (EUV) reticle.

By way of summation and review, when a pellicle is used for a long time, the pellicle may be contaminated. Therefore, it may be required to replace the contaminated pellicle with a new pellicle. Further, during replacement of the contaminated pellicle with the new pellicle, it may be required to clean the reticle on the pellicle. However, the cleaning process may damage the reticle pattern. Furthermore, when the cleaned reticle is assembled with the new pellicle, the reticle pattern may be distorted due to tension changes of the frame of the pellicle.

In contrast, example embodiments provide a pellicle capable of preventing damage to the reticle. That is, according to example embodiments, a locking portion of a holder of the pellicle may be detachably combined with a tapered locking groove of a frame, so that only the holder and the membrane of the pellicle may be replaced with a new holder and a new membrane, while a same frame of the pellicle may still be used. Thus, since the reticle is not separated from the frame and is maintained fixed thereto, the reticle may not require cleaning, thereby preventing potential damage to a reticle pattern of the reticle, e.g., during separation of the reticle from the frame and cleaning thereof. Further, the tapered locking groove of the frame and the tapered locking portion of the holder may exert substantially no force on the frame and reticle, so that a force applied to the holder during assembly/disassembly may suppressed, e.g., diverted, from the frame during installation of the new holder and the new membrane. Therefore, distortions of the reticle pattern may be suppressed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pellicle, comprising:
   a frame affixing a reticle, the frame having a tapered locking groove;
   a membrane facing the reticle; and
   a holder affixing the membrane, the holder having a locking portion that is detachably combined with the tapered locking groove of the frame.

2. The pellicle as claimed in claim 1, wherein the frame includes a tapered locking jaw, the tapered locking jaw defining the tapered locking groove within the frame.

3. The pellicle as claimed in claim 2, wherein the tapered locking jaw has a gradually decreasing thickness toward an outer surface of the frame.

4. The pellicle as claimed in claim 2, wherein the tapered locking jaw has a rounded end.

5. The pellicle as claimed in claim 2, further comprising a gap between the tapered locking jaw and the locking portion.

6. The pellicle as claimed in claim 1, wherein the locking portion has a tapered shape corresponding to a shape of the tapered locking groove.

7. The pellicle as claimed in claim 1, wherein the locking portion includes a resilient material, the resilient material being bendable by a force applied to the locking portion to release the locking portion from the tapered locking groove.

8. The pellicle as claimed in claim 7, further comprising a receiving groove at a connection portion between the locking portion and the holder, the receiving groove receiving the locking portion when bent.

9. The pellicle as claimed in claim 7, wherein the resilient material of the locking portion includes an aluminum alloy.

10. The pellicle as claimed in claim 1, wherein the tapered locking groove is arranged at two side surfaces of the frame.

11. The pellicle as claimed in claim 1, wherein the locking portion has an outer surface substantially coplanar with outer surfaces of the frame.

12. The pellicle as claimed in claim 1, wherein the reticle includes an extreme ultraviolet (EUV) reticle.

13. A pellicle, comprising:
    a first frame affixing a reticle, the first frame having a tapered locking groove;

a second frame on the first frame, the second frame having a locking portion that is detachably combined with the tapered locking groove of the first frame; and a membrane affixed to the second frame.

14. The pellicle as claimed in claim 13, wherein the locking portion includes a resilient material, the resilient material being bendable by a force applied to the locking portion to release the locking portion from the tapered locking groove.

15. The pellicle as claimed in claim 14, further comprising a receiving groove at a connection portion between the locking portion and the second frame, the receiving groove receiving the locking portion when bent.

16. A pellicle, comprising:
   a first frame affixing a reticle, the first frame having a tapered locking groove;
   a second frame on the first frame, the second frame having a locking portion with a locker having a complementary shape with respect to the tapered locking groove of the first frame and is detachably combinable with the tapered locking groove of the first frame; and
   a membrane affixed to the second frame, the second frame being between the membrane and the first frame.

17. The pellicle as claimed in claim 16, wherein the second frame is a frame-shaped holder, the locking portion including:

a locking body extending vertically from an outer surface of the holder toward the first frame; and
   the locker extending from the locking body toward the tapered locking groove, the locker having a decreasing thickness along the vertical direction.

18. The pellicle as claimed in claim 17, wherein:
   the first frame includes a tapered locking jaw, the tapered locking jaw extending from a sidewall of the first frame toward the locking body, and
   the tapered locking groove is defined between the tapered locking jaw and a bottom of the first frame, the locker fitting in the tapered locking groove when the holder is combinable with the first frame.

19. The pellicle as claimed in claim 18, wherein the holder includes a flat portion extending horizontally above the locking jaw, an upper groove being defined between the locking jaw and the flat portion of the holder.

20. The pellicle as claimed in claim 19, wherein the locking body and the locker are integral with each other and include a resilient metal, an upper portion of the locking body being bendable into the upper groove.

* * * * *